United States Patent
Jung et al.

(10) Patent No.: US 10,491,223 B2
(45) Date of Patent: Nov. 26, 2019

(54) MEMORY DEVICE INCLUDING A DELAY LOCKED LOOP AND OPERATING METHOD OF THE MEMORY DEVICE

(71) Applicant: SAMSUNG ELECTRONICS CO., LTD., Suwon-si, Gyeonggi-Do (KR)

(72) Inventors: Hangi Jung, Hwaseong-si (KR); Hun-Dae Choi, Hwaseong-si (KR); Juho Jeon, Bucheon-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/103,244

(22) Filed: Aug. 14, 2018

(65) Prior Publication Data
US 2019/0181869 A1  Jun. 13, 2019

(30) Foreign Application Priority Data
Dec. 8, 2017 (KR) .................. 10-2017-0168561

(51) Int. Cl.
H03L 7/081 (2006.01)
G11C 7/22 (2006.01)
H03L 7/08 (2006.01)

(52) U.S. Cl.
CPC ........... *H03L 7/0818* (2013.01); *G11C 7/222* (2013.01); *H03L 7/0805* (2013.01); *H03L 7/0814* (2013.01)

(58) Field of Classification Search
CPC ... H03L 7/0812; H03L 7/0814; H03L 7/0818; H03L 7/091; H03L 7/0816; H03L 7/10; H03L 7/08; H03L 7/14

USPC .......................................... 327/152, 153, 161
See application file for complete search history.

(56) References Cited

U.S. PATENT DOCUMENTS

| | | | |
|---|---|---|---|
| 6,727,738 B2 | 4/2004 | Tsukikawa | |
| 7,786,776 B2 | 8/2010 | Yamakido et al. | |
| 7,889,581 B2 | 2/2011 | Wakasa | |
| 8,766,688 B2 | 7/2014 | Choi | |
| 8,917,128 B1 | 12/2014 | Baek et al. | |
| 9,077,350 B2 | 7/2015 | Na et al. | |
| 2011/0050303 A1* | 3/2011 | Ma .................. | G11C 7/222 327/158 |
| 2017/0125076 A1 | 5/2017 | Jung | |

FOREIGN PATENT DOCUMENTS

| | | |
|---|---|---|
| JP | 2011124838 | 6/2011 |
| JP | 4790023 | 10/2011 |
| JP | 5290589 | 9/2013 |
| KR | 100630665 | 10/2006 |
| KR | 1020080011527 | 2/2008 |
| KR | 1020140029738 | 3/2014 |
| KR | 1020140071526 | 6/2014 |

(Continued)

*Primary Examiner* — John W Poos
(74) *Attorney, Agent, or Firm* — F. Chau & Associates, LLC

(57) ABSTRACT

A memory device includes a delay locked loop that generates a first code for delaying a reference clock in a first operation mode that is a normal operation mode, generates a second code for delaying the reference clock in a second operation mode that is a refresh mode, and delays the reference clock in response to one of the first and second codes depending on one of the first and second operation modes, and a data output circuit that outputs a data strobe signal (DQS) using the delayed reference clock.

18 Claims, 15 Drawing Sheets

(56) References Cited

FOREIGN PATENT DOCUMENTS

| KR | 1020140112663 | 9/2014 |
| KR | 1020140118657 | 10/2014 |
| KR | 1020150063242 | 6/2015 |

* cited by examiner

| MODE | CODE |
|---|---|
| MODE[1] | CODE[1] |
| MODE[2] | CODE[2] |
| MODE[3] | CODE[3] |

MEMORY DEVICE INCLUDING A DELAY LOCKED LOOP AND OPERATING METHOD OF THE MEMORY DEVICE

CROSS-REFERENCE TO RELATED APPLICATION

This application claims priority under 35 U.S.C. § 119 to Korean Patent Application No. 10-2017-0168561, filed on Dec. 8, 2017 in the Korean Intellectual Property Office, the disclosure of which is incorporated by reference herein in its entirety.

TECHNICAL FIELD

Exemplary embodiments of the inventive concept described herein relate to a semiconductor memory device, and more particularly, relate to a memory device including a delay locked loop and an operating method of the memory device.

DISCUSSION OF RELATED ART

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

A memory device may operate in synchronization with a clock applied from the outside. When the externally applied clock is used in the memory device, a time delay (or a clock skew) may occur due to an internal circuit of the memory device. A delay locked loop (DLL) may be used to compensate for the time delay. The delay locked loop may synchronize the memory device with the externally applied clock.

The delay locked loop may perform a locking operation for the purpose of synchronizing a phase of an input clock signal and a phase of a delayed output clock signal. However, when a voltage, a frequency, etc. associated with the internal circuits of the memory device varies, a locking time for synchronizing a clock phase may become long. When phase synchronization is not completed within a limited time, the integrity of input/output data of the memory device may be reduced.

SUMMARY

According to an exemplary embodiment of the inventive concept, a memory device includes a delay locked loop that generates a first code for delaying a reference clock in a first operation mode that is a normal operation mode, generates a second code for delaying the reference clock in a second operation mode that is a refresh mode, and delays the reference clock in response to one of the first and second codes depending on one of the first and second operation modes, and a data output circuit that outputs a data strobe signal (DQS) using the delayed reference clock.

According to an exemplary embodiment of the inventive concept, an operating method of a memory device includes receiving an initialization command, generating a first code corresponding to a first amount of delay of a reference clock in response to the initialization command, receiving a refresh command, before an initialization operation corresponding to the initialization command is completed, and generating a second code corresponding to a second amount of delay of the reference clock while performing a refresh operation in response to the refresh command, before the initialization operation is completed.

According to an exemplary embodiment of the inventive concept, an operating method of a memory device includes receiving an access command, determining an operation mode of the memory device in response to the access command, searching one of a plurality of codes stored in advance based on the operation mode, when the determined operation mode is a refresh mode where the memory device performs a refresh operation, and generating a new code corresponding to an amount of delay of a reference clock using the found code.

BRIEF DESCRIPTION OF THE FIGURES

The above and other objects and features of the inventive concept will become apparent by describing in detail exemplary embodiments thereof with reference to the accompanying drawings.

DETAILED DESCRIPTION OF THE EMBODIMENTS

Figure 1:
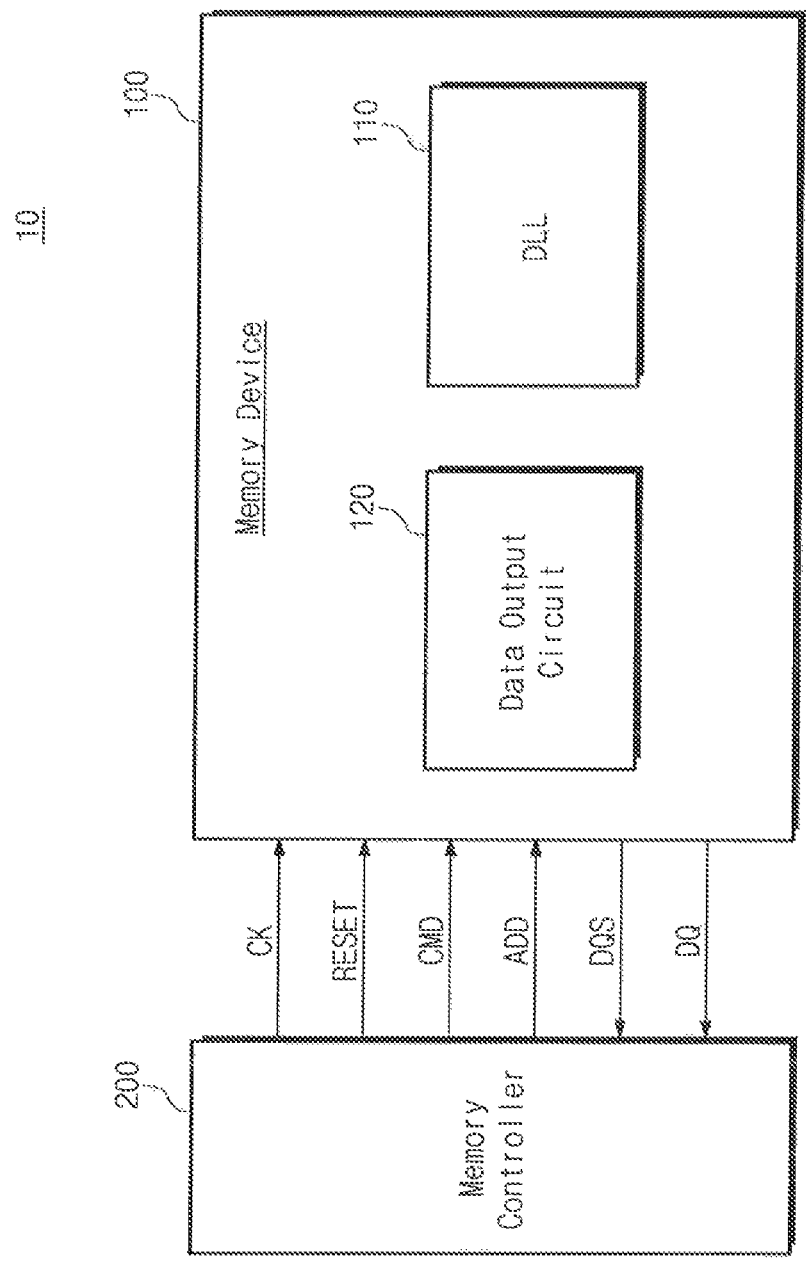
FIG. 1 is a block diagram of a semiconductor device according to an exemplary embodiment of the inventive concept.

Exemplary embodiments of the inventive concept provide a memory device including a delay locked loop for quickly performing a locking operation and an operating method of the memory device.

Below, exemplary embodiments of the inventive concept will be described in detail with reference to the accompanying drawings. Like reference numerals may refer to like elements throughout this application.

FIG. 1 is a block diagram of a semiconductor device according to an exemplary embodiment of the inventive concept. Referring to FIG. 1, a semiconductor device 10 may include a memory device 100 and a memory controller 200.

The memory device 100 may receive a clock signal CK, a reset signal RESET, a command CMD, and an address ADD from the memory controller 200. The memory device 100 may operate in synchronization with the clock signal CK. In an exemplary embodiment of the inventive concept, the memory device 100 may be a dynamic random access memory (DRAM). However, the inventive concept is not limited thereto. For example, the memory device 100 may include a volatile memory, such as a static RAM (SRAM), a DRAM, or a synchronous DRAM (SDRAM), or a non-volatile memory, such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

After the power of the semiconductor device 10 is turned on, the memory controller 200 may transmit the reset signal RESET to the memory device 100. The memory device 100 may receive the reset signal RESET to perform a reset operation. Depending on the reset operation, the memory device 100 may perform an initialization operation. Alternatively, the memory device 100 may receive a separate initialization command together with the reset signal RESET to perform the initialization operation.

The memory device 100 may perform an operation corresponding to the command CMD. In an exemplary embodiment of the inventive concept, the command CMD may include an activate command ACT, a read command RD, and a write command WR. The memory device 100 may perform a read or write operation, based on the address ADD.

The memory device 100 may output a data strobe signal DQS and a data signal DQ. The memory device 100 may output the data strobe signal DQS and the data signal DQ, based on the clock signal CK and the command CMD. For example, in the case of receiving the read command RD, the memory device 100 may generate the data strobe signal DQS synchronized with the clock signal CK. The memory device 100 may transmit the data signal DQ including read data to the memory controller 200 together with the data strobe signal DQS.

The memory device 100 may include a delay locked loop (DLL) 110 and a data output circuit 120. The delay locked loop 110 may delay a reference clock generated from the clock signal CK and may output an internal clock. The data output circuit 120 may output the data strobe signal DQS based on the internal clock output from the delay locked loop 110. The data output circuit 120 may output the data signal DQ synchronized together with the data strobe signal DQS. The data output circuit 120 may include a driver for driving an output of each signal.

The delay locked loop 110 may perform a locking operation to synchronize a phase of the reference clock and a phase of the data strobe signal DQS. The delay locked loop 110 may perform the locking operation based on a phase difference of the reference clock and the data strobe signal DQS. The delay locked loop 110 may determine the amount of delay (e.g., a delay time or a delay phase) associated with the reference clock as a result of performing the locking operation.

In an exemplary embodiment of the inventive concept, the delay locked loop 110 may perform at least one of a coarse locking operation and a fine locking operation to determine the amount of delay associated with the reference clock. The fine locking operation may be used to finely adjust the amount of delay compared with the coarse locking operation and may need a long locking time. Accordingly, the delay locked loop 110 may perform the fine locking operation after performing the coarse locking operation.

The delay locked loop 110 may delay the reference clock as much as the determined amount of delay to output the internal clock. A phase of the internal clock may be locked according to the determined amount of delay. As such, the data strobe signal DQS output from the data output circuit 120 based on the internal clock may be synchronized with the reference clock.

The delay locked loop 110 may perform the locking operation in the initialization operation. In an exemplary embodiment of the inventive concept, during the initialization operation, the delay locked loop 110 may perform the locking operation to determine the amount of delay associated with the reference clock. The delay locked loop 110 may store information about the determined amount of delay.

The delay locked loop 110 may continuously perform the locking operation after the initialization operation. In an exemplary embodiment of the inventive concept, in the case where an access operation (e.g., a read operation) is performed on the memory device 100, the delay locked loop 110 may perform the locking operation. In the case where the locking operation is performed in the access operation, the delay locked loop 110 may perform the locking operation by using the information about the amount of delay determined in the initialization operation.

The amount of delay determined in the initialization operation for the purpose of synchronizing the phase of the reference clock and the phase of the data strobe signal DQS may be different from the amount of delay determined in the access operation. The reason is that a voltage or a frequency associated with the delay locked loop 110 varies between the initialization operation and the access operation. Accordingly, the delay locked loop 110 may update the amount of delay, which is determined in the initialization operation, in the access operation, thus determining the new amount of delay.

In the case of using the information about the amount of delay determined in the initialization operation, the delay locked loop 110 may quickly perform an update operation for the amount of delay. For example, the update operation may include an operation of determining the new amount of delay by using information about the amount of delay determined in the initialization operation and delaying the reference clock based on the new amount of delay. In other words, the update operation may refer to the locking operation that is performed in the access operation after the initialization operation.

As described above, the delay locked loop 110 according to an exemplary embodiment of the inventive concept may perform the update operation by using a result from the locking operation performed in the initialization operation and may quickly synchronize the phases of the reference clock and the data strobe signal DQS.

Figure 2:
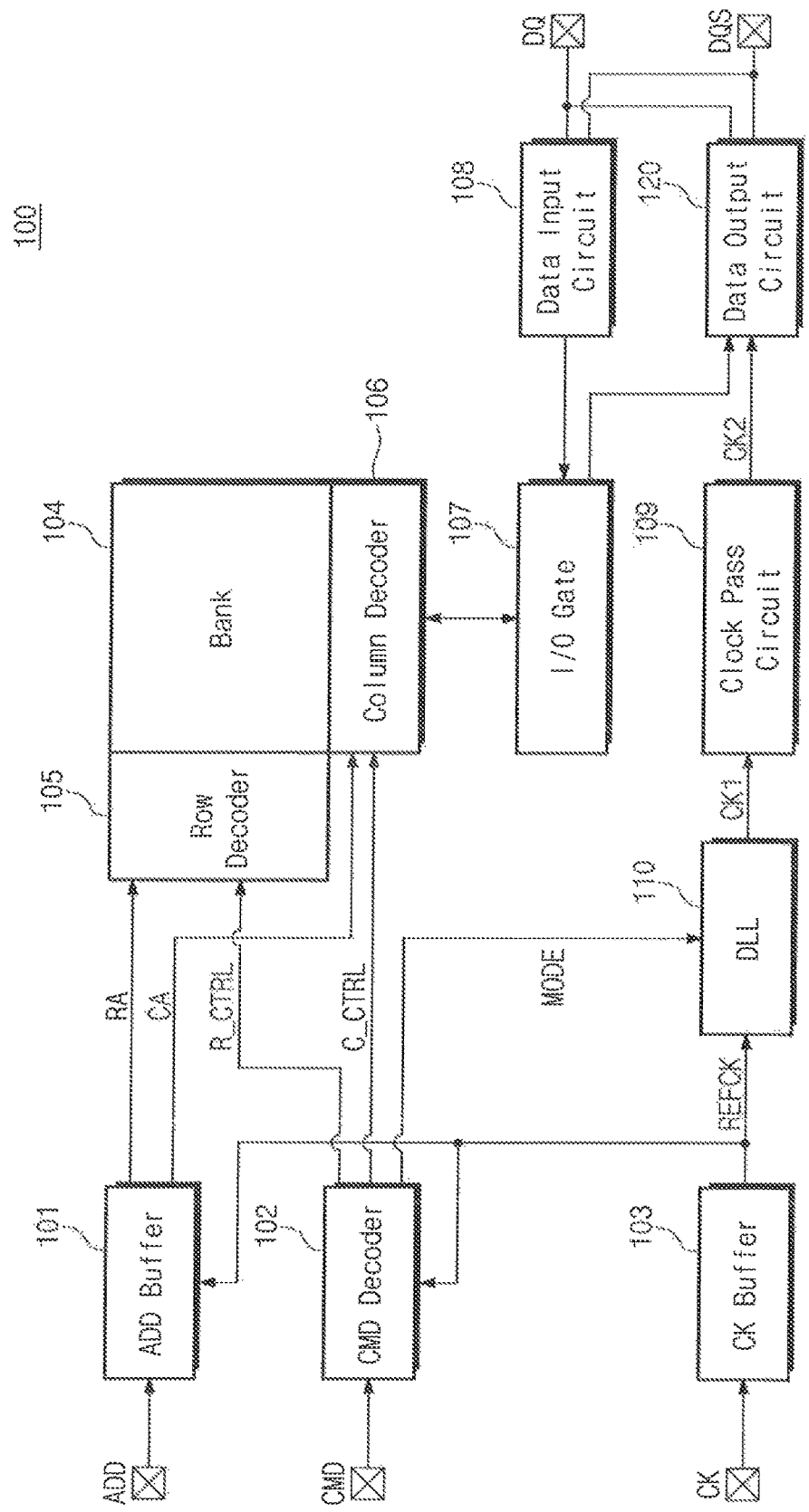
FIG. 2 is a block diagram illustrating a memory device included in the semiconductor device of FIG. 1 according to an exemplary embodiment of the inventive concept.

FIG. 2 is a block diagram illustrating a memory device included in the semiconductor device of FIG. 1 according to an exemplary embodiment of the inventive concept. Referring to FIGS. 1 and 2, the memory device 100 may include an address buffer 101, a command decoder 102, a clock buffer 103, the delay locked loop (DLL) 110, a bank 104, a row decoder 105, a column decoder 106, an input/output gate 107, a data input circuit 108, a clock pass circuit 109, and the data output circuit 120.

The address buffer 101 may receive the address ADD from the outside through an address pad. The address buffer 101 may operate in synchronization with a clock output from the clock buffer 103. The address buffer 101 may transmit a row address RA and a column address CA to the row decoder 105 and the column decoder 106, respectively.

The command decoder 102 may receive various commands CMD from the outside through a command pad. The command decoder 102 may operate in synchronization with the clock output from the clock buffer 103. The command decoder 102 may decode a write enable signal WE, a row address strobe signal RAS, a column address strobe signal CAS, an active signal ACT, a chip select signal CS, an address signal from the address buffer 101, or the like. The command decoder 102 may decode the command CMD and may generate a row decoder control signal R_CTRL, a column decoder control signal C_CTRL, and a mode signal MODE.

The mode signal MODE may indicate an operation mode of the memory device 100. The operation mode of the memory device 100 may be determined according to the decoding result of the command CMD, and the command decoder 102 may generate the mode signal MODE corresponding to the determined operation mode. For example, in the case where a refresh command is received, the command decoder 102 may generate the mode signal MODE indicating a refresh operation of the memory device 100. In the case where a plurality of refresh commands exist, the command decoder 102 may generate the mode signal MODE indicating each of a plurality of refresh operations.

The clock buffer 103 may receive the clock signal CK through a clock pad. The clock buffer 103 may generate a reference clock REFCK from the clock signal CK. The memory device 100 may transmit the reference clock to internal circuits illustrated in FIG. 1 and other internal circuits.

The bank 104 may include a memory cell array. For brevity of illustration, only one bank 104 is illustrated in FIG. 2, but the memory device 100 may include a plurality of banks. The size of the bank 104 or the number of banks may comply with the protocol or specification. The bank 104 may be controlled by the row decoder 105 and the column decoder 106.

In an exemplary embodiment of the inventive concept, a refresh operation of the bank 104 may be performed according to the refresh command. In the case where the memory device 100 includes a plurality of banks, the refresh operation may be performed on a part of the plurality of banks. In the case where the refresh operation is performed on a part of the plurality of banks, the access operation may be performed on the remaining banks, on which the refresh operation is not performed, from among the plurality of banks. For example, the refresh operation may be performed on a part of the plurality of banks, and the read operation may be performed on another part (or the remaining banks) of the plurality of banks. In other words, the refresh operation and the read operation may be substantially simultaneously performed in the memory device 100. This will be described further with reference to FIG. 7.

The row decoder 105 may activate a word line in response to the row address RA and the row decoder control signal R_CTRL. In detail, the row decoder 105 may select any word line when the memory device 100 receives an activate command from the outside.

The column decoder 106 may activate a bit line in response to the column address CA and the column decoder control signal C_CTRL. In detail, when the memory device 100 receives a read command or a write command from the outside, the column decoder 106 may select any bit line intersecting the selected word line.

The input/output gate 107 may write data in a memory cell disposed at an intersection of the selected word line and the selected bit line. In this case, the input/output gate 107 may receive write data from the data input circuit 108. The input/output gate 107 may read data from the memory cell disposed at the intersection of the selected word line and the selected bit line. In this case, the input/output gate 107 may transmit the read data to the data output circuit 120.

The data input circuit 108 may transmit write data received through a data pad to the input/output gate 107. In this case, the data input circuit 108 may receive the data strobe signal DQS through a data strobe pad together with the write data.

The data output circuit 120 may output the read data through the data pad. The data output circuit 120 may be provided with the read data from the input/output gate 107. In this case, the data output circuit 120 may output the data strobe signal DQS through a data strobe pad.

The delay locked loop 110 may receive the reference clock REFCK generated from the clock signal CK. The delay locked loop 110 may delay the reference clock REFCK and may output a first clock CK1. The delay locked loop 110 may determine the amount of delay of the reference clock REFCK based on a phase difference of the reference clock REFCK and the data strobe signal DQS. The delay locked loop 110 may output the first clock CK1 that is delayed according to the determined amount of delay.

The delay locked loop 110 may receive the mode signal MODE. The delay locked loop 110 may perform the locking operation depending on the operation mode of the memory device 100. In other words, the delay locked loop 110 may determine the amount of delay of the reference clock REFCK depending on the operation mode. In an exemplary embodiment of the inventive concept, in the case where the operation mode of the memory device 100 changes, the delay locked loop 110 may determine the amount of delay of the reference clock REFCK in a different manner. For example, the delay locked loop 110 may differently determine the amount of delay of the reference clock REFCK depending on the operation mode and may output the first clock CK1.

The clock pass circuit 109 may receive the first clock CK1. The clock pass circuit 109 may output a second clock CK2 based on the first clock CK1. In an exemplary embodiment of the inventive concept, the second clock CK2 may be delayed as much as a predetermined time with respect to the first clock CK1. In this case, the delay of the second clock CK2 may be determined by a characteristic of the clock pass circuit 109. In other words, the delay due to the clock pass circuit 109 may not be controlled.

The data output circuit 120 may receive the second clock CK2. The data output circuit 120 may output the data strobe signal DQS based on the second clock CK2. In an exemplary embodiment of the inventive concept, the data strobe signal DQS may be delayed as much as a predetermined time with respect to the second clock CK2. In this case, the delay of the data strobe signal DQS may be determined by a characteristic of the data output circuit 120. In other words, the delay due to the data output circuit 120 may not be controlled.

In the case where the amount of delay compensated by the delay locked loop 110 is matched with the amount of delay due to the clock pass circuit 109 and the data output circuit 120, a phase of the data strobe signal DQS output may be matched with a phase of the reference clock REFCK. In the case where the amount of delay compensated by the delay locked loop 110 is not matched with the amount of delay due to the clock pass circuit 109 and the data output circuit 120, the phase of the data strobe signal DQS output may not be matched with the phase of the reference clock REFCK. As such, a clock skew may increase, and a data valid window tDV may decrease.

Figure 3:
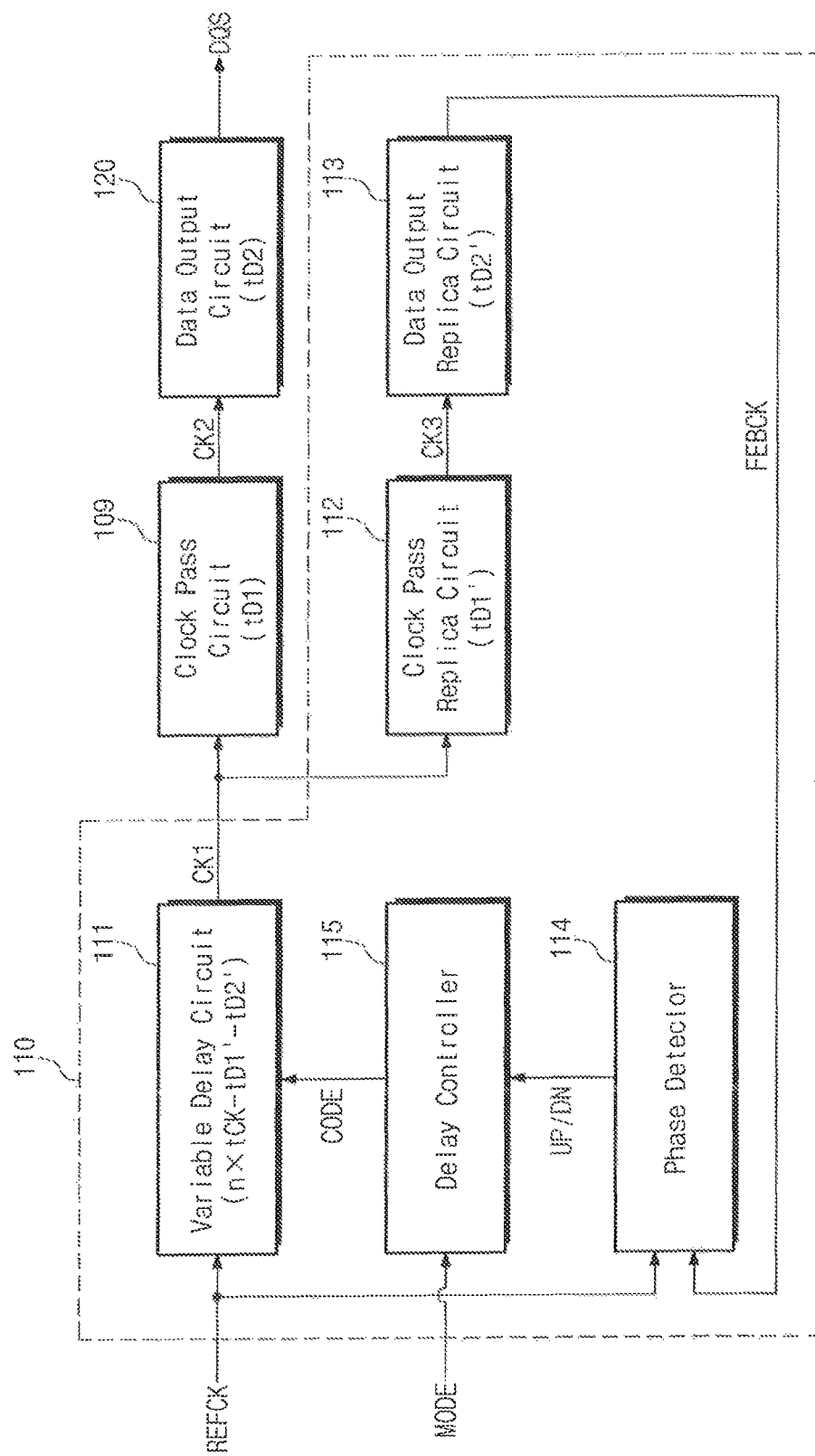
FIG. 3 is a block diagram for describing a delay locked loop of the memory device of FIG. 2 according to an exemplary embodiment of the inventive concept.

FIG. 3 is a block diagram for describing a delay locked loop of the memory device of FIG. 2 according to an exemplary embodiment of the inventive concept. Referring to FIGS. 1 to 3, the delay locked loop 110, the clock pass circuit 109, and the data output circuit 120 are illustrated in FIG. 3. Operations of the delay locked loop 110, the clock pass circuit 109, and the data output circuit 120 are similar to the operations described with reference to FIGS. 1 and 2, and thus, a detailed description thereof will not be repeated here.

The delay locked loop 110 may delay the reference clock REFCK and may output the first clock CK1. The clock pass circuit 109 may receive the first clock CK1. The first clock CK1 may be delayed as much as "tD1" by the clock pass circuit 109. The clock pass circuit 109 may output the second clock CK2 based on the delayed first clock CK1. The data output circuit 120 may receive the second clock CK2. The second clock CK2 may be delayed as much as "tD2" by the data output circuit 120. The data output circuit 120 may output the data strobe signal DQS based on the delayed second clock CK2.

The delay locked loop 110 may include a variable delay circuit 111, a clock pass replica circuit 112, a data output replica circuit 113, a phase detector 114, and a delay controller 115.

The variable delay circuit 111 may receive the reference clock REFCK and may delay the reference clock REFCK as much as "nxtCK−tD1'−tD2'." Here, "tCK" may be a period of the reference clock REFCK, and "n" may be a natural number. "tD1'" may be the amount of delay of the clock pass replica circuit 112, and "tD2'" may be the amount of delay of the data output replica circuit 113.

When the amount of delay of the variable delay circuit 111 is "nxtCK−tD1'−tD2'", the delay of the second clock CK2 that is obtained after the first clock CK1 passes through the clock pass circuit 109 may be "nxtCK−tD2'". The delay of the data strobe signal DQS that is obtained after the second clock CK2 passes through the data output circuit 120 may be "nxtCK". Accordingly, a phase of the data strobe signal DQS may be locked to a phase of the reference clock REFCK.

The clock pass replica circuit 112 may be a replica circuit of the clock pass circuit 109. In other words, the clock pass replica circuit 112 may be a circuit obtained by modeling the clock pass circuit 109. The clock pass replica circuit 112 may receive the first clock CK1, may delay the first clock CK1 as much as tD1', and may output a third clock CK3. The third clock CK3 may indicate a signal that is obtained by delaying the first clock CK1 as much as tD1'. The amount of delay tD1' of the clock pass replica circuit 112 may be substantially the same as the amount of delay tD1 of the clock pass circuit 109.

The data output replica circuit 113 may be a replica circuit of the data output circuit 120. In other words, the data output replica circuit 113 may be a circuit obtained by modeling the data output circuit 120. The data output replica circuit 113 may receive the third clock CK3, may delay the third clock CK3 as much as tD2', and may output a feedback clock FEBCK. The feedback clock FEBCK may indicate a signal that is obtained by delaying the third clock CK3 as much as tD2'. The amount of delay tD2' of the data output replica circuit 113 may be substantially the same as the amount of delay tD2 of the data output circuit 120.

The phase detector 114 may receive the reference clock REFCK and the feedback clock FEBCK. The phase detector 114 may detect a phase difference of the reference clock REFCK and the feedback clock FEBCK. The phase detector 114 may generate an up signal UP and a down signal DN, based on the detected result. For example, in the case where a phase of the reference clock REFCK precedes a phase of the feedback clock FEBCK, the phase detector 114 may generate the up signal UP. In contrast, in the case where the phase of the reference clock REFCK lags behind the phase of the feedback clock FEBCK, the phase detector 114 may generate the down signal DN.

The delay controller 115 may adjust the delay of the variable delay circuit 111 by using the detection result of the phase detector 114. In detail, the delay controller 115 may generate a code "CODE" based on the up and down signals UP and DN. For example, in the case of receiving the up signal UP, the delay controller 115 may generate the code "CODE" such that a delay decreases. In the case of receiving the down signal DN, the delay controller 115 may generate the code "CODE" such that the delay increases.

The amount of delay (e.g., nxtCK−tD1'−tD2') of the variable delay circuit 111 may be adjusted by the code "CODE". In an exemplary embodiment of the inventive concept, the code "CODE" may be a signal of a binary form corresponding to the amount of delay.

The mode signal MODE corresponding to the operation mode of the memory device 100 may be provided to the delay controller 115. The delay controller 115 may generate the code "CODE" corresponding to the mode signal MODE. For example, in the case where the memory device 100 does not perform a separate operation other than the locking operation, the operation mode of the memory device 100 may be a normal operation mode. The mode signal MODE corresponding to the normal operation mode may be provided to the delay controller 115, and the delay controller 115 may generate the code "CODE" based on the mode signal MODE corresponding to the normal operation mode. Alternatively, in the case where the memory device 100 performs the locking operation while performing the refresh operation, the operation mode of the memory device 100 may be a refresh mode. The mode signal MODE corresponding to the refresh mode may be provided to the delay controller 115, and the delay controller 115 may generate the code "CODE" based on the mode signal MODE corresponding to the refresh mode.

The delay controller 115 may store the code "CODE" that is generated based on the operation mode of the memory device 100. The delay controller 115 may store the generated code "CODE" so as to correspond to the operation mode of the memory device 100. For example, the code "CODE" generated in the normal operation mode may be stored to correspond to the normal operation mode, and the code "CODE" generated in the refresh mode may be stored to correspond to the refresh mode.

The delay locked loop 110 may perform the locking operation in response to the mode signal MODE, in the initialization operation. In the initialization operation, the delay locked loop 110 may generate a plurality of codes based on various mode signals. The delay locked loop 110 may store the generated codes so as to correspond to the operation modes. For example, during the initialization operation, the delay locked loop 110 may perform the locking operation in the normal operation mode to generate the code "CODE" and may store the generated code "CODE" so as to correspond to the normal operation mode. Afterwards, the delay locked loop 110 may perform the locking operation in the refresh mode to generate the code "CODE" and may store the generated code "CODE" so as to correspond to the refresh mode. The delay locked loop 110 may complete the initialization operation after generating the code "CODE" corresponding to each operation mode.

As described above, the delay locked loop 110 may perform the locking operation under various situations, in the initialization operation. In an exemplary embodiment of the inventive concept, there may be sequentially performed operations of the memory device 100 that have an influence on a voltage, a frequency, etc. associated with the delay locked loop 110, in the initialization operation. At substantially the same time, the delay locked loop 110 may perform the locking operation, may generate the code "CODE" corresponding to each operation, and may store the generated code "CODE".

After the initialization operation, the delay locked loop 110 may perform the locking operation and may update the generated code "CODE". The delay controller 115 may generate the new code "CODE" by using the code "CODE" generated in the initialization operation. In an exemplary embodiment of the inventive concept, the delay controller 115 may update the code "CODE" that is generated according to the mode signal MODE. The delay controller 115 may generate the new code "CODE" based on a code, which corresponds to the mode signal MODE, from among a plurality of codes stored in the initialization operation.

In other words, in the case of performing the update operation on the code "CODE" generated in the initialization operation, the delay controller 115 may perform the update operation based on the operation mode of the memory device 100. In the case of the same operation mode, a difference between a value of the code "CODE" generated in the initialization operation and a value of the code "CODE" generated after the initialization operation may be small. Accordingly, in the case of performing the update operation by using the code "CODE" generated in the initialization operation, a change in a code value may be small, and thus, the delay locked loop 110 may quickly perform the update operation.

Figure 4:
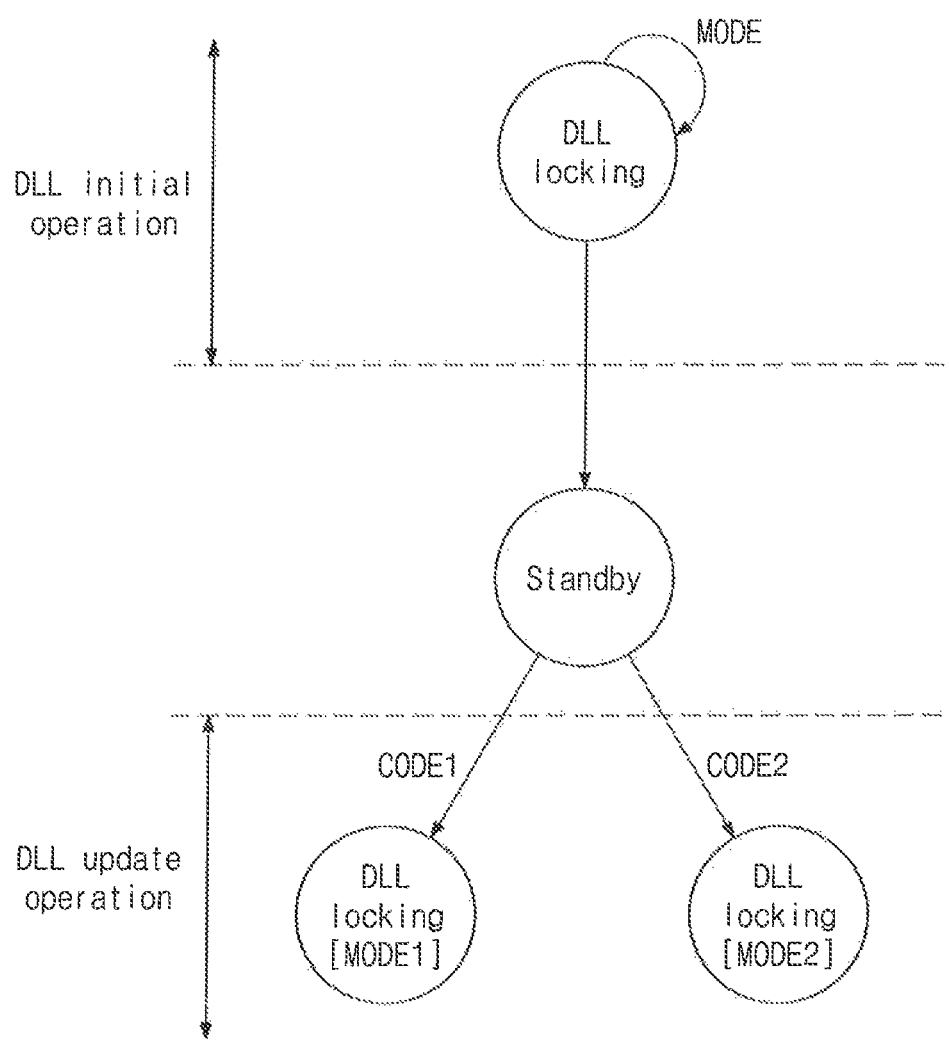
FIG. 4 is a view illustrating operation states of the delay locked loop of FIG. 3 according to an exemplary embodiment of the inventive concept.

FIG. 4 is a view illustrating operation states of the delay locked loop of FIG. 3 according to an exemplary embodiment of the inventive concept. Referring to FIGS. 3 and 4, in the initialization operation, the delay locked loop 110 may sequentially perform the locking operation based on the mode signal MODE. The delay locked loop 110 may store the code "CODE" generated by the locking operation together with a relevant operation mode.

After the initialization operation is completed, the delay locked loop 110 may be in a standby state. When the access operation is performed on the memory device 100, the delay locked loop 110 may perform the update operation. In an exemplary embodiment of the inventive concept, in the case where the locking operation is performed in a first operation mode MODE1, the delay locked loop 110 may perform the locking operation by using a first code CODE1 corresponding to the first operation mode MODE1. In the case where the locking operation is performed in a second operation mode MODE2, the delay locked loop 110 may perform the locking operation by using a second code CODE2 corresponding to the second operation mode MODE2. Here, in the initialization operation, each of the first code CODE1 and the second code CODE2 may be the code "CODE" that is generated and stored in a relevant operation mode.

Below, the initialization operation of the delay locked loop 110 will be described in detail with reference to FIGS. 5 to 10.

Figures 5, 6:
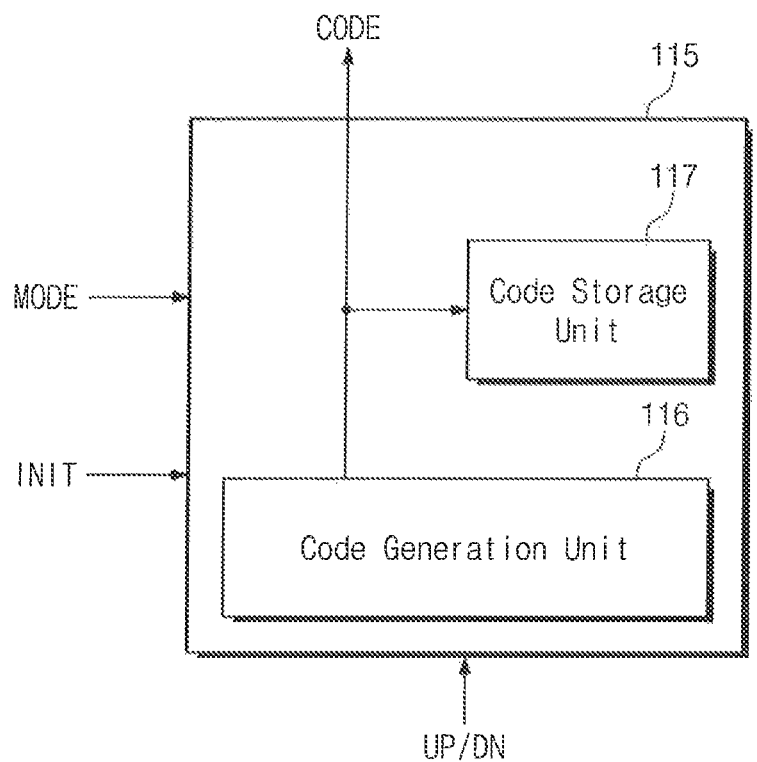
FIG. 5 is a block diagram illustrating a delay controller according to an exemplary embodiment of the inventive concept.
FIG. 6 is a view illustrating codes stored in a code storage unit included in the delay controller of FIG. 5 according to an exemplary embodiment of the inventive concept.

FIG. 5 is a block diagram illustrating a delay controller according to an exemplary embodiment of the inventive concept. Referring to FIG. 5, the delay controller 115 may include a code generation unit 116 and a code storage unit 117. The code generation unit 116 may start an operation of generating the code "CODE" based on the up and down signals UP and DN depending on an initialization command INIT. In an exemplary embodiment of the inventive concept, the initialization command INIT may be a command received from the outside for the initialization operation.

The code generation unit 116 may generate another code "CODE" in response to the mode signal MODE, upon generating the code "CODE". Each of the generated codes "CODE" may be stored in the code storage unit 117 together with the relevant mode signal MODE.

FIG. 6 is a view illustrating codes stored in a code storage unit included in the delay controller of FIG. 5 according to an exemplary embodiment of the inventive concept. Referring to FIGS. 5 and 6, the code storage unit 117 may include a data field indicating an operation mode of the memory device 100 and a data field indicating the code "CODE". The code storage unit 117 may store a first code CODE[1] generated in a first operation mode MODE[1] so as to correspond to the first operation mode MODE[1]. The code storage unit 117 may store a second code CODE[2] generated in a second operation mode MODE[2] so as to correspond to the second operation mode MODE[2]. The code storage unit 117 may store a third code CODE[3] generated in a third operation mode MODE[3] so as to correspond to the third operation mode MODE[3]. For example, each of the first to third operation modes MODE[1] to MODE[3] may correspond to a normal operation mode or one of a plurality of refresh modes.

The first to third codes CODE[1] to CODE[3] respectively corresponding to the first to third operation modes MODE[1] to MODE[3] are illustrated in FIG. 6, but the inventive concept is not limited thereto. In an exemplary embodiment of the inventive concept, the delay locked loop 110 may generate and store the code "CODE" corresponding to each of various operation modes.

Figure 7:
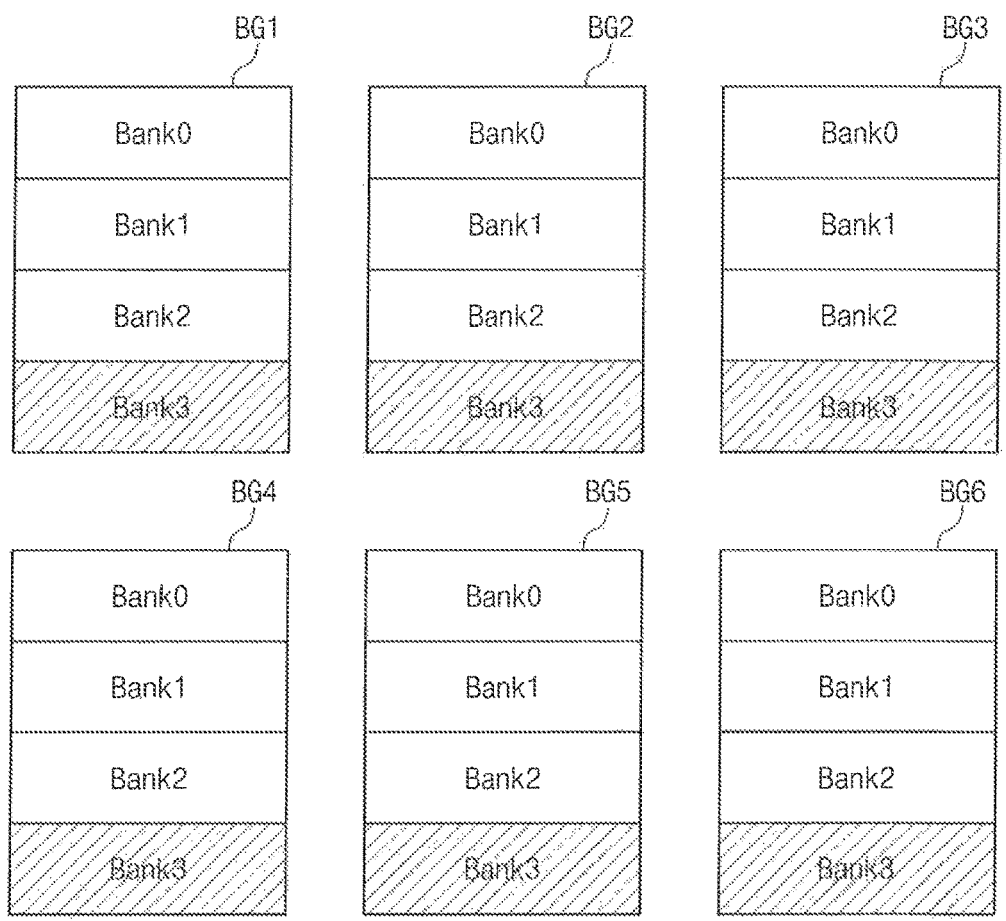
FIG. 7 is a view illustrating a same bank refresh (SBR) mode of a plurality of refresh modes according to an exemplary embodiment of the inventive concept.

FIG. 7 is a view illustrating a same bank refresh (SBR) mode of a plurality of refresh modes according to an exemplary embodiment of the inventive concept. Referring to FIGS. 2 and 7, the memory device 100 may include first to sixth bank groups BG1 to BG6, each of which includes 0-th to third banks Bank0 to Bank3.

The memory device 100 may perform a refresh operation in response to an internal or external SBR command. The memory device 100 may perform a refresh operation only on a particular bank of the 0-th to third banks Bank0 to Bank3, in response to the SBR command. As illustrated in FIG. 7, the memory device 100 may perform the refresh operation on the third bank Bank3 included in each of the first to sixth bank groups BG1 to BG6. An access operation (e.g., a read operation) may be performed on the 0-th to second banks Bank0 to Bank2 while the refresh operation is performed on the third bank Bank3. In other words, the memory device 100 may simultaneously receive the SBR command and an access command (e.g., the read command RD) and may substantially simultaneously perform the refresh operation and the access operation.

The SBR mode described in FIG. 7 may be only an example of one of a plurality of refresh modes, and the inventive concept is not limited thereto. The memory device 100 may perform a refresh operation in response to a CAS before RAS (CBR) command, and may substantially simultaneously perform an access operation (e.g., a read operation) while performing the refresh operation corresponding to the CBR command.

As described above, the memory device 100 according to an exemplary embodiment of the inventive concept may substantially simultaneously perform the access operation while performing the refresh operation. The delay locked loop 110 may perform the locking operation depending on the access operation of the memory device 100, and the locking operation may be performed while the refresh operation is performed. Accordingly, the delay locked loop 110 may receive the mode signal MODE corresponding to the refresh operation and may generate the code "CODE" corresponding to the refresh operation mode.

Figure 8:
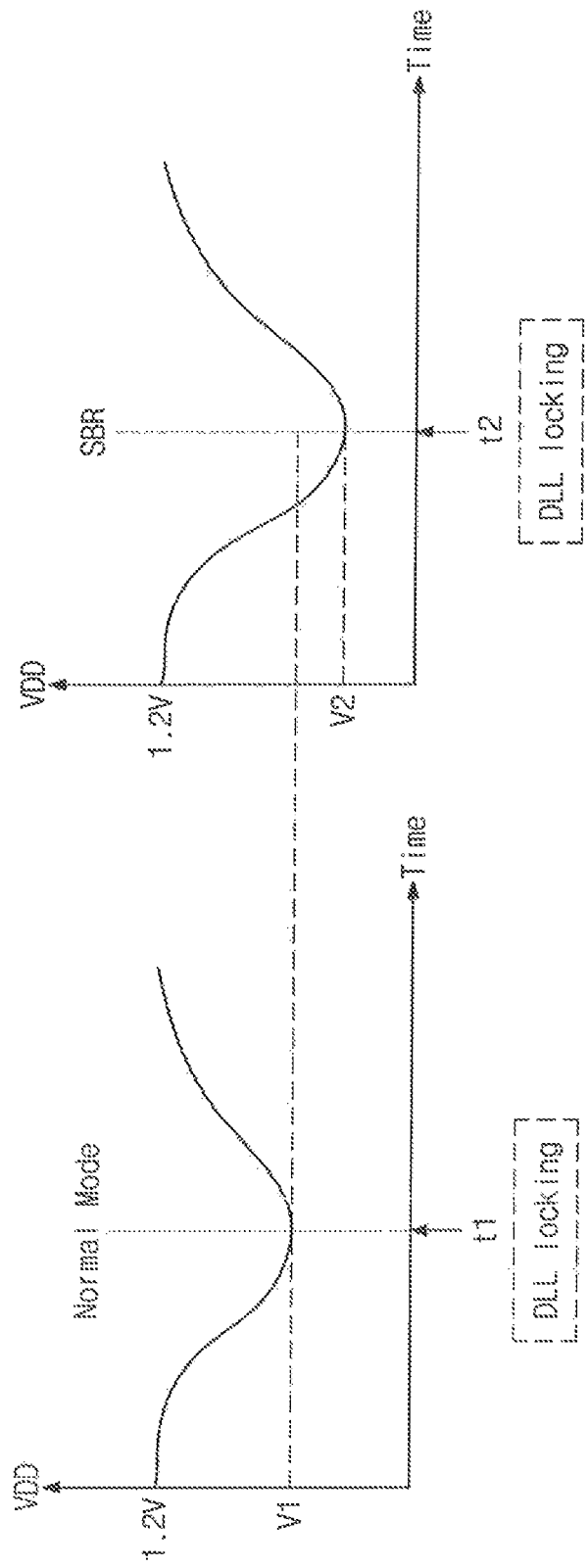
FIG. 8 is a view illustrating a locking operation of a delay locked loop according to an exemplary embodiment of the inventive concept.

FIG. 8 is a view illustrating a locking operation of a delay locked loop according to an exemplary embodiment of the inventive concept. FIG. 8 shows an example of a locking operation corresponding to a normal operation mode and an example of a locking operation corresponding to the SBR mode.

In FIG. 8, a horizontal axis represents time, and a vertical axis represents a voltage VDD input to the delay locked loop 110. Below, a description will be given with reference to FIGS. 3 and 8. In the case where a separate operation other than the locking operation is not performed in the memory device 100 (e.g., a normal operation mode), a voltage input according to the initialization operation may decrease to a first voltage V1. The delay locked loop 110 may perform the locking operation and may generate the code "CODE" corresponding to the normal operation mode. The code "CODE" corresponding to the normal operation mode may be affected by a level of the input voltage. In the case where the locking operation is performed at a first time t1, the code "CODE" that depends on the level of the first voltage V1 may be generated.

In the case where an SBR operation is performed in the memory device 100, a voltage input to the delay locked loop 110 may decrease to a second voltage V2. A level of the second voltage V2 may be smaller than a level of the first voltage V1. The delay locked loop 110 may perform the locking operation and may generate the code "CODE" corresponding to the SBR mode. The code "CODE" corresponding to the SBR mode may be affected by a level of the input voltage. In the case where the locking operation is performed at a second time t2, the code "CODE" that depends on the level of the second voltage V2 may be generated.

As illustrated in FIG. 8, a level of a voltage input to the delay locked loop 110 may vary with each mode. In the case where the level of the input voltage varies, the code "CODE" generated to synchronize the reference clock REFCK and the data strobe signal DQS may change. In other words, the code "CODE" generated in the normal operation mode and the code "CODE" generated in the SBR mode may be different.

Figure 9:
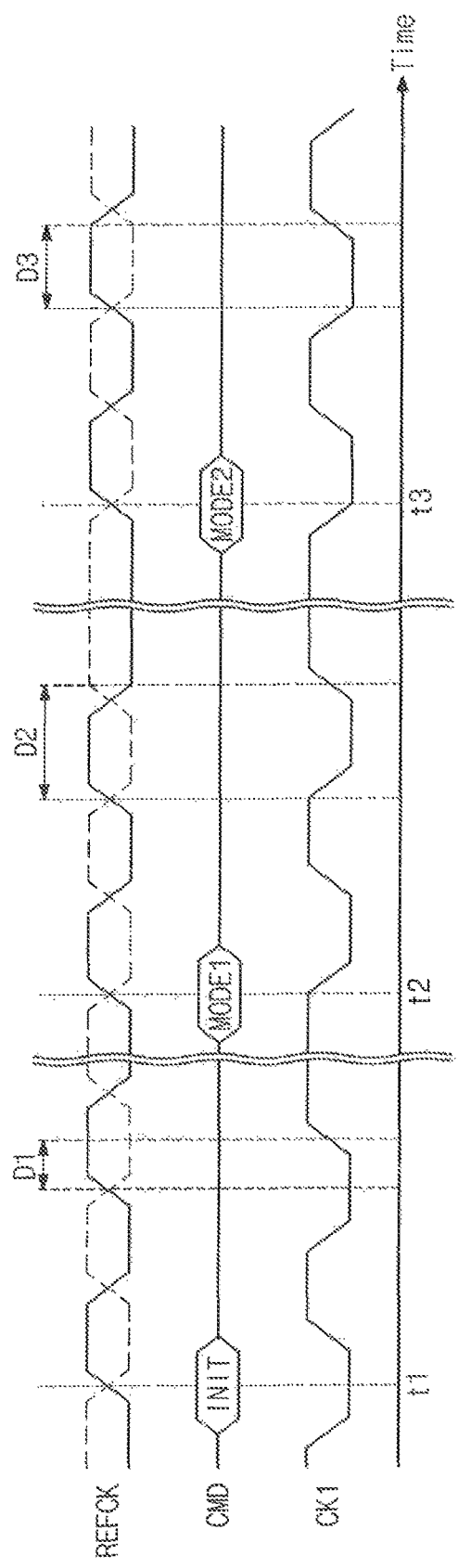
FIG. 9 is a timing diagram illustrating an output of a delay locked loop according to an exemplary embodiment of the inventive concept.

FIG. 9 is a timing diagram illustrating an output of a delay locked loop according to an exemplary embodiment of the inventive concept. In detail, FIG. 9 shows an output of the delay locked loop 110 in the initialization operation. Referring to FIGS. 1 and 9, the delay locked loop 110 may output the first clock CK1 after delaying the reference clock REFCK. At a first time t1, in the case of receiving the initialization command INIT (or the reset signal RESET), the delay locked loop 110 may perform the locking operation. In this case, the memory device 100 may not perform a separate operation other than the locking operation. The delay locked loop 110 may perform a comparison with the reference clock REFCK through the locking operation and may output the first clock CK1 delayed as much as the first amount of delay D1. The first amount of delay D1 may indicate a time (interval) between a rising edge of the reference clock REFCK and a rising edge of the first clock CK1. The delay locked loop 110 may generate the code "CODE" corresponding to the first amount of delay D1 and may store the generated code "CODE" so as to correspond to the normal operation mode.

After the code "CODE" is generated in the normal operation mode, in the case of receiving the first operation mode MODE1 at a second time t2, the memory device 100 may perform an operation corresponding to the first operation mode MODE1. The delay locked loop 110 may perform the locking operation while the memory device 100 performs the corresponding operation. The delay locked loop 110 may perform a comparison with the reference clock REFCK through the locking operation and may output the first clock CK1 delayed as much as the second amount of delay D2. The second amount of delay D2 may indicate a time (interval) between a rising edge of the reference clock REFCK and a rising edge of the first clock CK1. The delay locked loop 110 may generate the code "CODE" corresponding to the second amount of delay D2 and may store the generated code "CODE" so as to correspond to the first operation mode MODE1.

For example, the first operation mode MODE1 may be the SBR mode, and the delay locked loop 110 may generate the relevant code "CODE" while the memory device 100 performs an operation corresponding to the SBR mode. The delay locked loop 110 may store the generated code "CODE" so as to correspond to the SBR mode.

After the code "CODE" is generated in the SBR mode, in the case of receiving the second operation mode MODE2 at a third time t3, the memory device 100 may perform an operation corresponding to the second operation mode MODE2. The delay locked loop 110 may perform the locking operation while the memory device 100 performs the corresponding operation. The delay locked loop 110 may perform a comparison with the reference clock REFCK through the locking operation and may output the first clock CK1 delayed as much as the third amount of delay D3. The third amount of delay D3 may indicate a time (interval) between a rising edge of the reference clock REFCK and a rising edge of the first clock CK1. In this case, the delay locked loop 110 may generate the code "CODE" corresponding to the third amount of delay D3 and may store the generated code "CODE" so as to correspond to the second operation mode MODE2.

For example, the second operation mode MODE2 may be the CBR mode, and the delay locked loop 110 may generate the relevant code "CODE" while the memory device 100 performs an operation corresponding to the CBR mode. The delay locked loop 110 may store the generated code "CODE" so as to correspond to the CBR mode.

As illustrated in FIG. 9, the amounts of delays D1 to D3 associated with the first clock CK1 may vary with the respective modes. In other words, codes generated in the delay locked loop 110 may vary with each mode.

Figure 10:
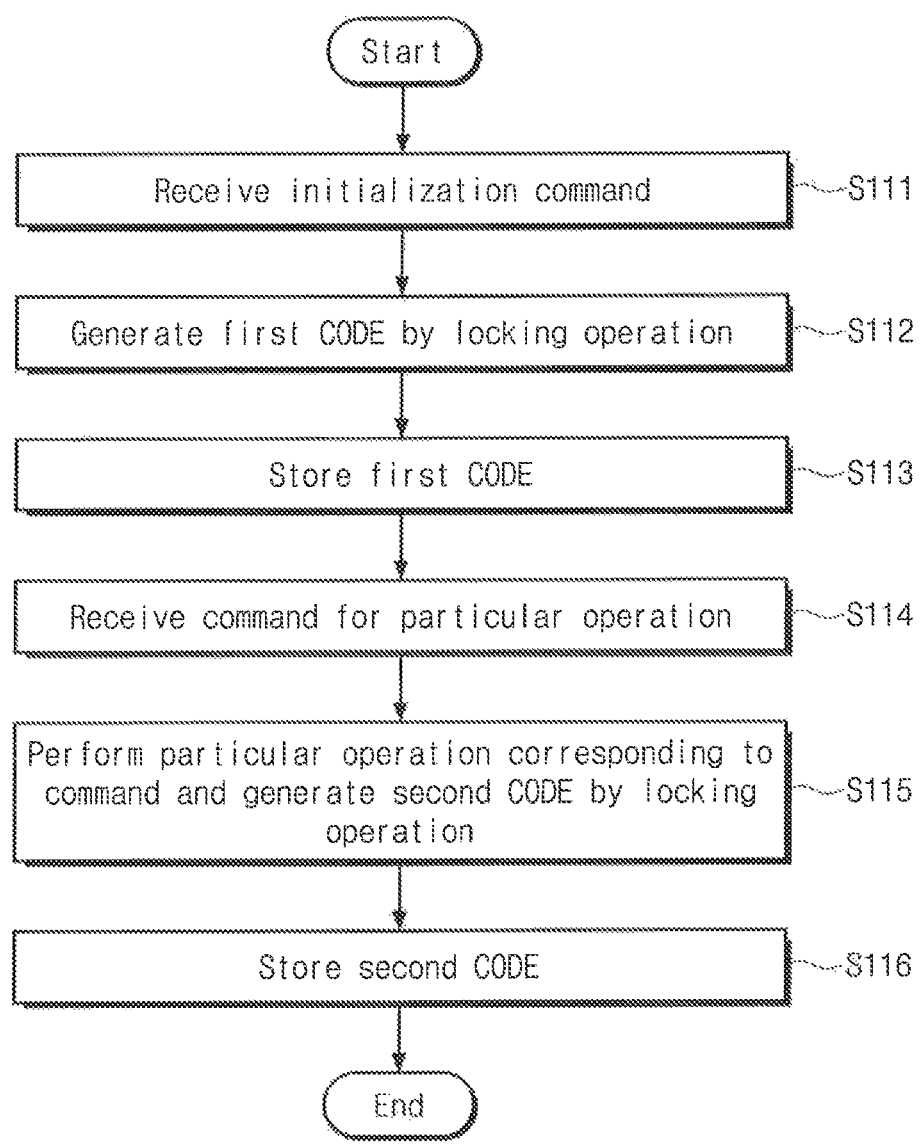
FIG. 10 is a flowchart illustrating an operation of the memory device of FIG. 1 according to an exemplary embodiment of the inventive concept.

FIG. 10 is a flowchart illustrating an operation of the memory device of FIG. 1 according to an exemplary embodiment of the inventive concept. Referring to FIGS. 1 and 10, in operation S111, the memory device 100 may receive an initialization command from the memory controller 200. In the case of receiving the initialization command, the memory device 100 may perform the initialization operation.

In operation S112, the memory device 100 may perform the locking operation and may generate a first code. The memory device 100 may not perform a separate operation while performing the locking operation. In operation S113, the memory device 100 may store the generated first code. For example, the delay locked loop 110 may store the generated first code so as to correspond to the normal operation mode.

In operation S114, the memory device 100 may receive a command for a particular operation. The command for the particular operation may be a command that has an influence on a voltage, a frequency, etc. associated with the delay locked loop 110. For example, the memory device 100 may receive a command for a refresh operation such as an SBR operation or a CBR refresh operation.

In operation S115, the memory device 100 may perform the particular operation corresponding to the command and may perform the locking operation to generate a second code. The memory device 100 may substantially simultaneously perform the particular operation and the locking operation. In operation S116, the memory device 100 may store the generated second code so as to correspond to the particular operation mode.

An example is illustrated in FIG. 10 where the memory device 100 performs the locking operation two times, but the inventive concept is not limited thereto. In an exemplary embodiment of the inventive concept, in the case of receiving a command corresponding to each of various operation modes in the initialization operation, the memory device 100 may repeatedly perform operation S114 to operation S116. As such, the memory device 100 may generate the code "CODE" corresponding to each operation mode and may store the generated code "CODE" so as to correspond to each operation mode.

Below, the update operation of the delay locked loop 110 will be described in detail with reference to FIGS. 11 to 15.

Figure 11:
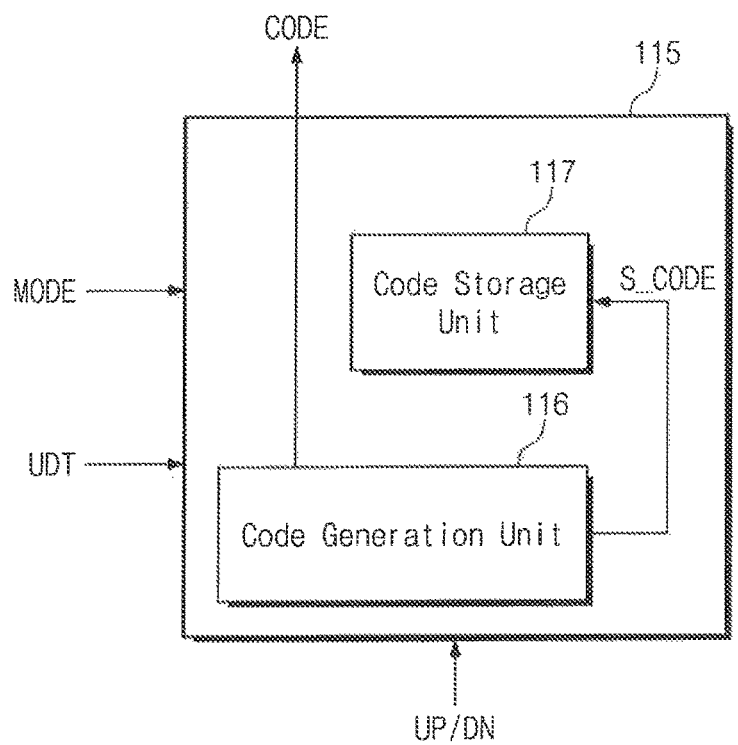
FIG. 11 is a block diagram illustrating a delay controller according to an exemplary embodiment of the inventive concept.

FIG. 11 is a block diagram illustrating a delay controller according to an exemplary embodiment of the inventive concept. Referring to FIG. 11, the delay controller 115 may include the code generation unit 116 and the code storage unit 117. In the case where an update signal UDT is received, the code generation unit 116 may generate the code "CODE" based on the up and down signals UP and DN.

In an exemplary embodiment of the inventive concept, the update signal UDT may be a command that is generated within the memory device 100 for the purpose of performing an update operation on the generated code "CODE". For example, for an access operation, the memory device 100 may generate the update signal UDT.

In the case where the update signal UDT is received, the code storage unit 117 may provide the code generation unit 116 with a code S_CODE stored according to the mode signal MODE. The stored code S_CODE that is the code "CODE" generated in the initialization operation may be about a particular operation mode.

The code generation unit 116 may generate the code "CODE" based on the code S_CODE provided from the code storage unit 117. Since the provided code S_CODE is the code "CODE" generated in the same operation mode, a difference between a value of the code "CODE" to be newly generated in the update operation and a value of the provided code S_CODE may not be large. Accordingly, in the case of using the provided code S_CODE, the code generation unit 116 may quickly complete the locking operation. In other words, the delay controller 115 may quickly perform the update operation.

Figure 12:
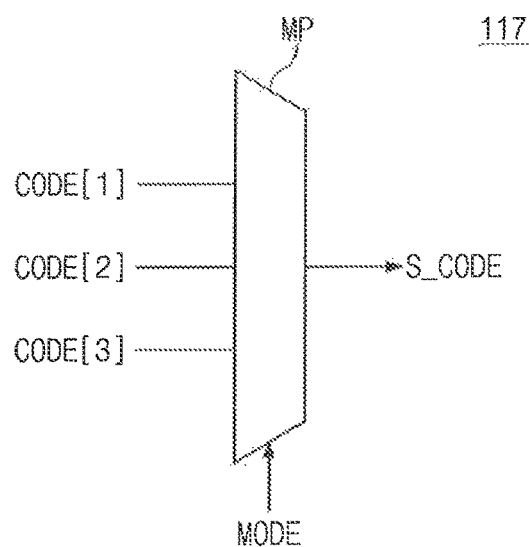
FIG. 12 is a view illustrating an operation of a code storage unit included in the delay controller of FIG. 11 according to an exemplary embodiment of the inventive concept.

FIG. 12 is a view illustrating an operation of a code storage unit included in the delay controller of FIG. 11 according to an exemplary embodiment of the inventive concept. Referring to FIGS. 11 and 12, the code storage unit 117 may include a multiplexer MP. The multiplexer MP may receive the mode signal MODE as a control input and may select one of the first code CODE[1] to the third code CODE[3] based on the mode signal MODE. The multiplexer MP may output the selected code S_CODE to the code generation unit 116.

The first code CODE[1] to the third code CODE[3] are illustrated in FIG. 12, but the inventive concept is not limited thereto. The code storage unit 117 may store various codes of varying number and may output the code S_CODE corresponding to the mode signal MODE among the various codes.

Figure 13:
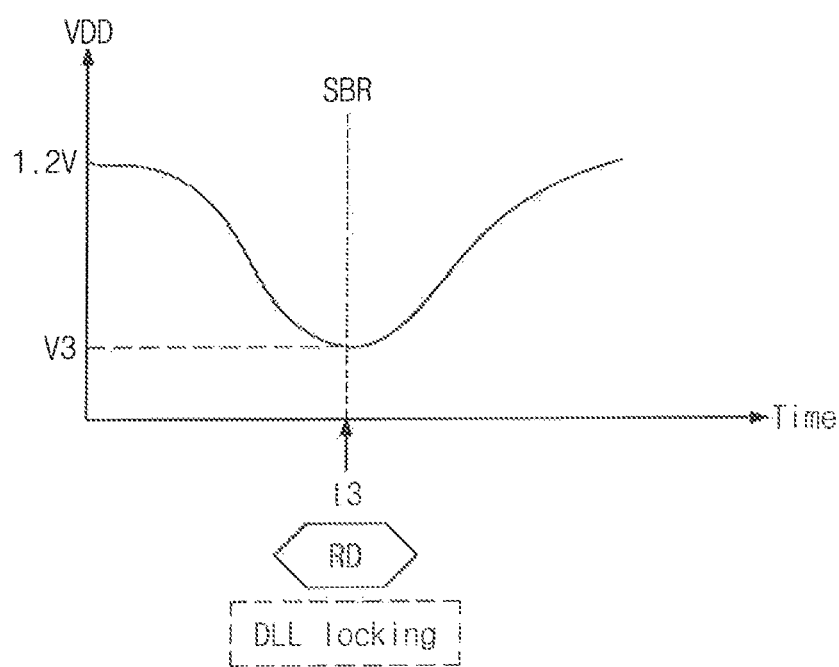
FIG. 13 is a view illustrating an update operation of a delay locked loop according to an SBR mode according to an exemplary embodiment of the inventive concept.

FIG. 13 is a view illustrating an update operation of a delay locked loop according to an SBR mode according to an exemplary embodiment of the inventive concept. In FIG. 13, a horizontal axis represents time, and a vertical axis represents the voltage VDD input to the delay locked loop 110. Below, a description will be given with reference to FIGS. 1 and 13. After the initialization operation, at a third time t3, the memory device 100 may receive an SBR command to perform an SBR operation. At substantially the same time, the memory device 100 may receive the read command RD to perform a read operation.

For the read operation, the delay locked loop 110 may perform the locking operation. The delay locked loop 110 may perform the locking operation by using the code "CODE" that corresponds to the SBR mode and is generated in the initialization operation. In other words, the delay locked loop 110 may update the code "CODE" corresponding to the SBR mode.

As illustrated in FIG. 13, in the case where an SBR operation is performed in the memory device 100, a voltage input to the delay locked loop 110 may decrease to a third voltage V3. The decrease to the third voltage V3 may be similar to a level change of a voltage according to the same operation mode. For example, a level of the third voltage V3 may be similar to a level of the second voltage V2 according to the SBR mode of FIG. 8. In the case where levels of voltages are similar, values of generated codes may be similar. In other words, a value of the code "CODE" generated in the SBR mode during the initialization operation may be similar to a value of the code "CODE" to be generated in the SBR mode during the update operation. Accordingly, in the case of using the code "CODE" corresponding to the SBR mode, since a change in a code value is small, an update time of the delay locked loop 110 may decrease.

However, the level change of the input voltage of FIG. 13 may be different from a level change of a voltage according to another operation mode in the initialization operation. For example, the level of the third voltage V3 may be different from the level of the first voltage V1 according to the normal operation mode of FIG. 8. In the case where levels of voltages are different, values of generated codes may be different. In other words, a difference between a value of the code "CODE" generated in the normal operation mode during the initialization operation and a value of the code "CODE" to be generated in the SBR mode during the update operation may be large. Accordingly, in the case of using the code "CODE" corresponding to the normal operation mode, since a change in a code value is large, an update time of the delay locked loop 110 may increase.

Figure 14:
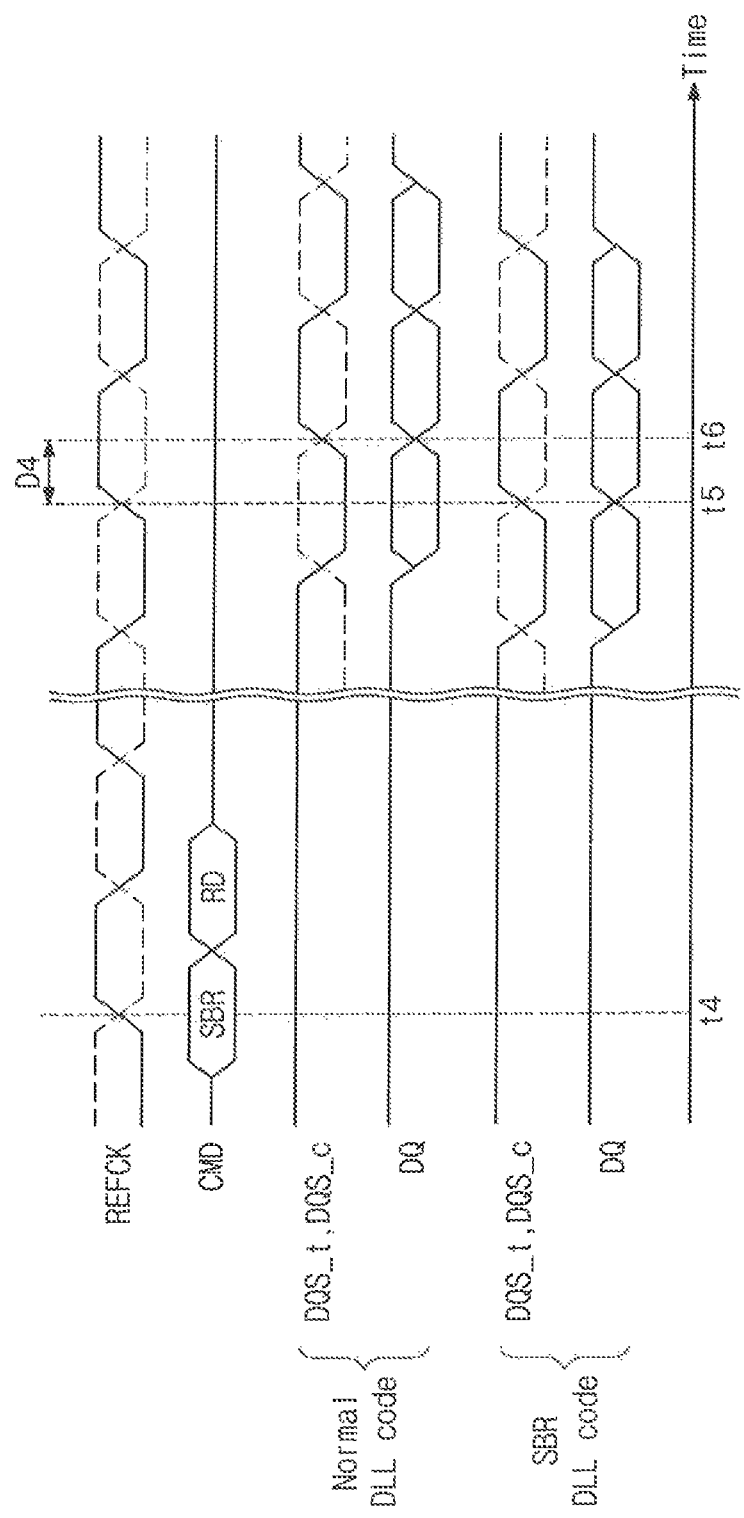
FIG. 14 is a timing diagram illustrating an output of the memory device of FIG. 1 according to an exemplary embodiment of the inventive concept.

FIG. 14 is a timing diagram illustrating an output of the memory device of FIG. 1 according to an exemplary embodiment of the inventive concept. Referring to FIGS. 1 and 14, at a fourth time t4, the memory device 100 may receive an SBR command SBR and may receive the read command RD. However, the inventive concept is not limited thereto. For example, the SBR command and the read command RD may be substantially simultaneously received, or the read command RD may be received before the SBR command SBR is received.

The memory device 100 may perform an SBR operation based on the SBR command SBR. Additionally, the memory device 100 may receive the read operation based on the read command RD. The memory device 100 may substantially simultaneously perform the SBR operation and the read operation. For the read operation, the memory device 100 may perform the locking operation to synchronize phases of the reference clock REFCK and the data strobe signal DQS. The data strobe signal DQS output from the memory device 100 may be output in a differential manner. In other words, the memory device 100 may output data strobe signals DQS_t and DQS_c. The memory device 100 may output the data signal DQ synchronized with the data strobe signals DQS_t and DQS_c, e.g., may output read data.

In the case where the delay locked loop 110 generates only one code "CODE" in the initialization operation (e.g., in the case of generating only the code "CODE" corresponding to the normal operation mode), the delay locked loop 110 may perform the update operation by using the code "CODE" corresponding to the normal operation mode. As described with reference to FIG. 13, in the case where the update operation is performed by using the code "CODE" corresponding to the normal operation mode upon performing the SBR operation, an update time may increase. In general, a time for update may be defined in advance according to the protocol and specification. In the case where an update operation takes a long time, the memory device 100 cannot complete the update operation within the predefined time. Accordingly, the memory device 100 may output the data strobe signal DQS that is not synchronized with the phase of the reference clock REFCK.

As illustrated in FIG. 14, a clock skew corresponding to the fourth amount of delay D4 may occur between the reference clock REFCK and the data strobe signals DQS_t and DQS_c. The fourth amount of delay D4 may indicate a time interval between a rising edge (a fifth time t5) of the reference clock REFCK and rising and falling (or falling and rising) edges (a sixth time t6) of the data strobe signals DQS_t and DQS_c. Accordingly, the data valid window tDV of the memory device 100 may become worse.

In the case where the delay locked loop 110 generates a plurality of codes in the initialization operation (e.g., in the case of generating the code "CODE" corresponding to the SBR mode), the delay locked loop 110 may perform the update operation by using the code "CODE" corresponding to the SBR mode. As described with reference to FIG. 13, in the case where the update operation is performed by using the code "CODE" corresponding to the same mode upon performing the SBR operation, an update time may decrease. In the case where the update operation is quickly performed, the memory device 100 may complete the update operation within the predefined time. Accordingly, the memory device 100 may output the data strobe signal DQS that is synchronized with the phase of the reference clock REFCK.

Referring to the fifth time t5 of FIG. 14, a phase of the reference clock REFCK and a phase of the data strobe signal DQS may be matched. Accordingly, the data valid window tDV of the memory device 100 may be increased compared with the update operation using the code "CODE" corresponding to the normal operation mode.

Figure 15:
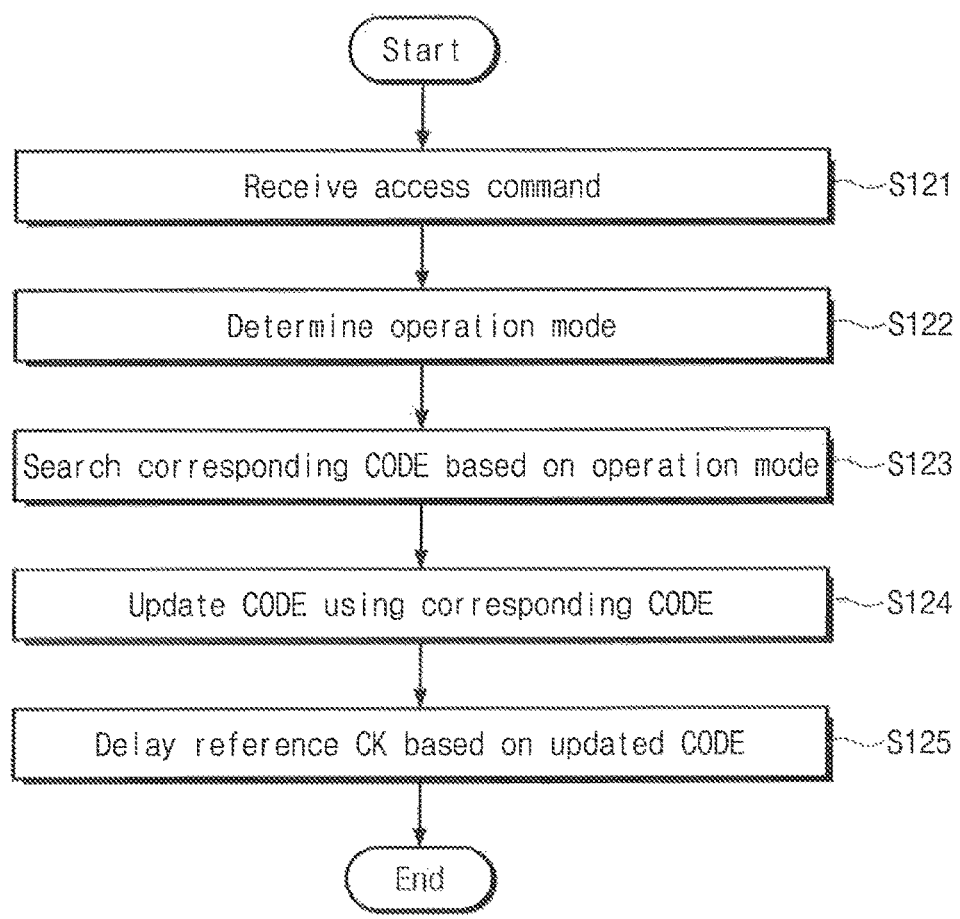
FIG. 15 is a flowchart illustrating an operation of the memory device of FIG. 1 according to an exemplary embodiment of the inventive concept.

FIG. 15 is a flowchart illustrating an operation of the memory device of FIG. 1 according to an exemplary embodiment of the inventive concept. In detail, FIG. 15 shows the update operation of the memory device 100 after the initialization operation. Referring to FIGS. 1 and 15, in operation S121, the memory device 100 may receive an access command. For example, the access command may include the read command RD or the write command WR.

In operation S122, the memory device 100 may determine an operation mode. The memory device 100 may determine an operation mode based on a state of an operation being currently performed. For example, the memory device 100 may determine the operation mode as one of the normal operation mode, the SBR mode, and the CBR mode.

In operation S123, the memory device 100 may search the code "CODE" corresponding to the determined operation mode. In an exemplary embodiment of the inventive concept, the memory device 100 may store in advance codes corresponding to operation modes.

The memory device 100 may search the code "CODE" corresponding to the operation mode among the stored codes.

In operation S124, the memory device 100 may update the code "CODE" by using the corresponding code "CODE". In operation S125, the memory device 100 may delay the reference clock REFCK based on the updated code "CODE". The memory device 100 may perform an access operation based on the delayed reference clock REFCK. For example, the memory device 100 may perform a read operation or a write operation based on the delayed reference clock REFCK.

A description is given in FIG. 15 where the operating method of the memory device 100 selects one of codes stored in advance to correspond to various operation modes, but the inventive concept is not limited thereto. The memory device 100 according to an exemplary embodiment of the inventive concept may differently operate depending on a refresh operation mode and an operation mode that is not the refresh operation mode. For example, in the case of the refresh operation mode, the memory device 100 may select one of codes stored in advance to correspond to various refresh operation modes and may perform the update operation by using the selected code. In the case where an operation mode is not the refresh operation mode, the memory device 100 may perform the update operation by using a particular code corresponding to a normal operation without searching codes stored in advance.

Figure 16A:
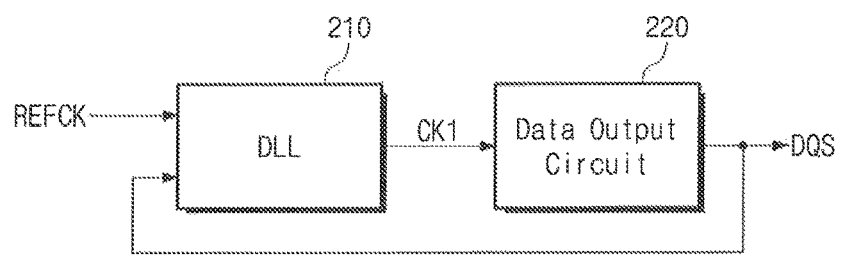
FIGS. 16A and 16B are block diagrams for describing a delay locked loop according to exemplary embodiments of the inventive concept.
Figure 16B:
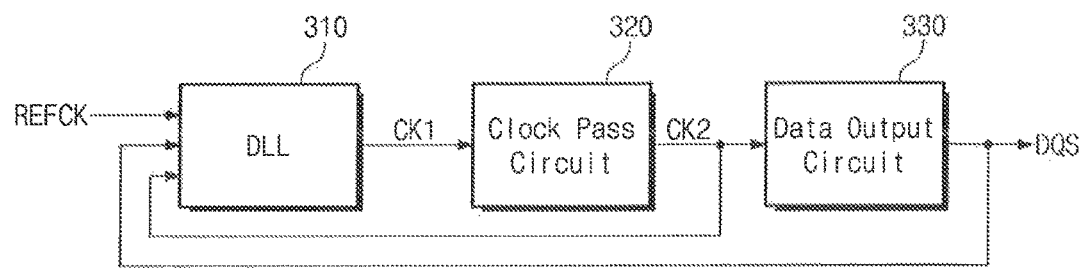

FIGS. 16A and 16B are block diagrams for describing a delay locked loop according to exemplary embodiments of the inventive concept. Referring to FIG. 16A, a delay locked loop 210 and a data output circuit 220 are illustrated. Operations of the delay locked loop 210 and the data output circuit 220 are similar to the operations of the delay locked loop 110 and the data output circuit 120 described with reference to FIGS. 1 to 15, and thus, a detailed description thereof will not be repeated here.

The delay locked loop 210 may delay the reference clock REFCK and may output the first clock CK1. The data output circuit 220 may output the data strobe signal DQS based on the first clock CK1. The first clock CK1 may be delayed by the data output circuit 220 as much as a predetermined time.

The delay locked loop 210 may delay the reference clock REFCK for the purpose of synchronizing a phase of the reference clock REFCK and a phase of the data strobe signal DQS. The delay locked loop 210 may determine the amount of delay of the reference clock REFCK based on a phase difference of the reference clock REFCK and the data strobe signal DQS.

Referring to FIG. 16B, a delay locked loop 310, a clock pass circuit 320, and a data output circuit 330 are illustrated. Operations of the delay locked loop 310, the clock pass circuit 320, and the data output circuit 330 are similar to the operations of the delay locked loop 110, the clock pass circuit 109, and the data output circuit 120 described with reference to FIGS. 1 to 15, and thus, a detailed description thereof will not be repeated here.

The delay locked loop 310 may delay the reference clock REFCK and may output the first clock CK1. The clock pass circuit 320 may output the second clock CK2 based on the first clock CK1. The first clock CK1 may be delayed by the clock pass circuit 320 as much as a predetermined time. The data output circuit 330 may output the data strobe signal DQS based on the second clock CK2. The second clock CK2 may be delayed by the data output circuit 330 as much as a predetermined time.

The delay locked loop 310 may delay the reference clock REFCK for the purpose of synchronizing a phase of the reference clock REFCK and a phase of the data strobe signal DQS. The delay locked loop 310 may determine the amount of delay of the reference clock REFCK based on a phase of the reference clock REFCK, a phase of the second clock CK2, and a phase of the data strobe signal DQS.

In an exemplary embodiment of the inventive concept, the delay locked loop 210/310 may differently determine the amount of delay depending on an operation mode of the memory device 100 in the initialization operation. The delay locked loop 210/310 may store information (e.g., the code "CODE") about the amount of delay so as to correspond to an operation mode. After the initialization operation, the delay locked loop 210/310 may update the information about the amount of delay based on an operation mode of the memory device 100 in the update operation. The delay locked loop 210/310 may perform the update operation by using the information about the amount of delay stored in the initialization operation. The information about the amount of delay that is used in the update operation may be information generated in the same operation mode. For example, the operation mode may include one of a normal operation mode and a plurality of refresh modes.

Figure 17:
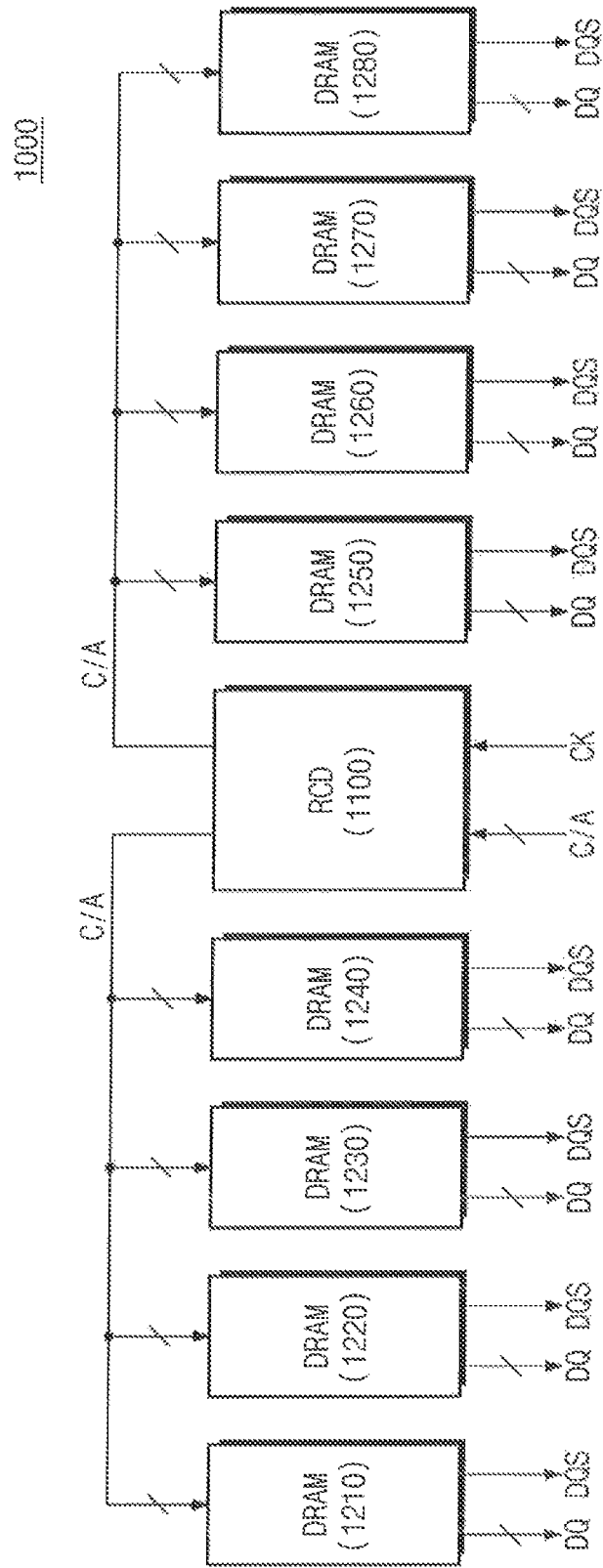
FIG. 17 is a block diagram illustrating a memory module including a memory device according to an exemplary embodiment of the inventive concept.

FIG. 17 is a block diagram illustrating a memory module including a memory device according to an exemplary embodiment of the inventive concept. Referring to FIG. 17, a memory module 1000 may include a register clock driver (RCD) 1100 and a plurality of DRAM devices 1210 to 1280.

The RCD 1100 may receive a command/address C/A and a clock signal CK from an external device (e.g., a host or a memory controller). The RCD 1100 may provide the command/address C/A to the plurality of DRAM devices 1210 to 1280, based on received signals.

Each of the plurality of DRAM devices 1210 to 1280 may output a plurality of data signals DQ and the data strobe signal DQS. In an exemplary embodiment of the inventive concept, each of the plurality of DRAM devices 1210 to 1280 may include the delay locked loop described with reference to FIGS. 1 to 16. Each of the plurality of DRAM devices 1210 to 1280 may transmit data to an external device (e.g., a host or a memory controller) through the plurality of data signals DQ, based on the data strobe signal DQS.

As described above, the memory device 100 according to an exemplary embodiment of the inventive concept may generate and store in advance delay codes corresponding to various operation modes. In the case of updating the delay codes, the memory device 100 may perform an update operation by using the code "CODE" corresponding to the operation mode among the delay codes stored in advance. Accordingly, the memory device 100 may quickly compensate for a phase difference of the reference clock REFCK and the data strobe signal DQS.

According to exemplary embodiments of the inventive concept, there may be provided a delay locked loop that quickly synchronizes a phase of a reference clock and a phase of a data strobe signal in various operation modes of a memory device. Accordingly, the memory device may minimize the occurrence of a clock skew and may increase a data valid window (tDV).

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
a delay locked loop configured to generate a first code for delaying a reference clock in a first operation mode that is a normal operation mode, to generate a second code for delaying the reference clock in a second operation mode that is a refresh mode, and to delay the reference clock in response to one of the first and second codes depending on one of the first and second operation modes; and
a data output circuit configured to output a data strobe signal (DQS) using the delayed reference clock,
wherein the delay locked loop includes:
a code storage unit configured to store the first and second codes and to output one of the first and second codes depending on one of the first and second operation modes.

2. The memory device of claim 1, wherein the delay locked loop includes:
a phase detector configured to detect a phase difference of the reference clock and the data strobe signal;

a delay controller configured to generate the first code in the first operation mode and the second code in the second operation mode, in response to the detected phase difference; and a variable delay circuit configured to delay the reference clock in response to a code generated in the delay controller.

3. The memory device of claim 1, wherein the delay locked loop delays the reference clock to output a first clock, wherein the memory device further comprises a clock pass circuit configured to output a second clock using the first clock, and wherein the data output circuit outputs the data strobe signal using the second clock.

4. The memory device of claim 3, wherein the delay locked loop includes:

a clock pass replica circuit configured to delay the first clock to output a third clock; and a data output replica circuit configured to delay the third clock to output a feedback clock, wherein a phase of the third clock is substantially the same as a phase of the second clock and a phase of the feedback clock is substantially the same as a phase of the data strobe signal.

5. The memory device of claim 4, wherein the delay locked loop generates the first and second codes using a phase difference of the reference clock and the feedback clock.

6. The memory device of claim 1, further comprising:

bank groups each including a first bank and a second bank, wherein the refresh mode is associated with an operation of refreshing one of the first and second banks included in each of the bank groups.

7. The memory device of claim 1, wherein the first code and the second code are generated in an initialization operation of the delay locked loop.

8. The memory device of claim 7, wherein, after the initialization operation, the delay locked loop is configured to generate a third code using the first code when a first access operation corresponding to the first operation mode is requested and to generate a fourth code using the second code when a second access operation corresponding to the second operation mode is requested.

9. The memory device of claim 8, wherein each of the first and second access operations is a read operation.

10. The memory device of claim 9, wherein the read operation is substantially simultaneously performed in the refresh mode.

11. An operating method of a memory device, the method comprising:

receiving an initialization command;

generating a first code corresponding to a first amount of delay of a reference clock in response to the initialization command;

receiving a refresh command, before an initialization operation corresponding to the initialization command is completed;

generating a second code corresponding to a second amount of delay of the reference clock while performing a refresh operation in response to the refresh command, before the initialization operation is completed;

storing the first code so as to correspond to a normal operation mode; and storing the second code so as to correspond to a refresh mode.

12. The method of claim 11, wherein the refresh command includes one of a same bank refresh (SBR) command and a CAS before RAS (CBR) command.

13. The method of claim 11, further comprising:

receiving an access command after the initialization operation is completed;

determining an operation mode in response to the access command;

selecting a code corresponding to the determined operation mode among the first code and the second code; and generating a third code corresponding to a third amount of delay of the reference clock by using the selected code.

14. The method of claim 13, further comprising:

delaying the reference clock using the third code; and performing an operation corresponding to the access command depending on the delayed reference clock.

15. The method of claim 14, wherein, when the determined operation mode is the refresh mode and the access command is a read command, a read operation is performed while the refresh operation is performed.

16. An operating method of a memory device, the method comprising:

receiving an access command;

determining an operation mode of the memory device in response to the access command;

searching one of a plurality of codes stored in advance based on the operation mode, when the determined operation mode is a refresh mode where the memory device performs a refresh operation; and generating a new code corresponding to an amount of delay of a reference clock using the found code.

17. The method of claim 16, further comprising:

generating the new code using a particular code stored in advance, when the determined operation mode is not the refresh mode.

18. The method of claim 17, wherein the particular code stored in advance corresponds to a normal operation mode of the memory device.

* * * * *